United States Patent [19]

Kinsbron

[11] Patent Number: 4,472,212
[45] Date of Patent: Sep. 18, 1984

[54] METHOD FOR FABRICATING A SEMICONDUCTOR DEVICE

[75] Inventor: Eliezer Kinsbron, Highland Park, N.J.

[73] Assignee: AT&T Bell Laboratories, Murray Hill, N.J.

[21] Appl. No.: 558,996

[22] Filed: Dec. 7, 1983

Related U.S. Application Data

[63] Continuation of Ser. No. 352,519, Feb. 26, 1982, abandoned.

[51] Int. Cl.$^3$ ............................................. H01L 21/225
[52] U.S. Cl. ...................................... 148/188; 29/571; 148/186; 148/187
[58] Field of Search ...................... 148/186, 187, 188; 29/571

[56] References Cited

U.S. PATENT DOCUMENTS

| | | | |
|---|---|---|---|
| 2,802,760 | 8/1957 | Derick et al. | 148/186 X |
| 2,953,486 | 9/1960 | Atalla | 148/1.5 |
| 3,418,180 | 12/1968 | Ku | 143/187 |
| 3,502,517 | 3/1970 | Sussman | 148/188 X |
| 3,664,896 | 5/1972 | Duncan | 148/187 |
| 3,808,060 | 4/1974 | Hays et al. | 148/187 |
| 3,928,095 | 12/1975 | Harigaya et al. | 148/190 X |
| 4,063,967 | 12/1977 | Graul et al. | 148/1.5 |
| 4,136,434 | 1/1979 | Thibault et al. | 29/578 X |
| 4,274,892 | 6/1981 | Templin | 148/188 |
| 4,354,309 | 10/1982 | Gardiner et al. | 148/188 X |
| 4,389,255 | 6/1983 | Chen et al. | 148/188 X |

*Primary Examiner*—G. Ozaki
*Attorney, Agent, or Firm*—Lucian C. Canepa

[57] ABSTRACT

A method for forming a shallow and highly concentrated arsenic doped surface layer in a silicon bulk region includes the steps of forming an arsenic doped polysilicon layer in contact with a preselected area of a bulk region surface in which the surface layer is to be formed and completely oxidizing the polysilicon layer at a rate exceeding the rate at which arsenic diffuses in the bulk region. Since arsenic has a relatively high silicon/silicon dioxide segregation coefficient and the oxidation rate exceeds the arsenic diffusion rate, arsenic accumulates at the silicon dioxide/silicon interface during oxidation, and nearly all of the arsenic in the region of the polysilicon layer above the preselected area is driven into the bulk region surface by the oxidation to form an impurity layer having a very high surface concentration of arsenic.

12 Claims, 4 Drawing Figures

METHOD FOR FABRICATING A SEMICONDUCTOR DEVICE

This application is a continuation of application Ser. No. 352,519, filed Feb. 26, 1982, and now abandoned.

BACKGROUND OF THE INVENTION

This invention relates to semiconductor device fabrication and more particularly to a method for forming a relatively shallow and highly concentrated impurity layer adjacent to the surface of a semiconductive region.

In the fabrication of semiconductor devices, such as integrated circuits, it is generally required that significant dopant impurities be introduced into a surface of a semiconductive region in order to form a surface impurity layer having electrical characteristics which are different from those of the rest of the region. By using appropriate impurities in appropriate amounts there may be formed a surface layer of the opposite conductivity type to that of the rest of the region, a surface layer of the same conductivity type as the rest of the region but having a lower resistivity or a surface layer of the same conductivity type as the rest of the region but having a higher resistivity. This invention provides a novel and advantageous method for forming such a surface impurity layer.

For example, in the fabrication of integrated circuits, it is generally desirable to reduce the lateral dimensions of circuit features to achieve a higher packing density, improved performance and a lower power dissipation. Recently, the development of improved lithographic and etching techniques have made it possible to form circuit features having lateral dimensions of less than 1 μm. However, in order to fabricate integrated circuits having such submicron features, it is necessary and/or desirable to provide relatively shallow surface impurity layers having relatively low sheet resistances.

In the case of metal-oxide-semiconductor (MOS) circuits, a reduction in the channel length of a MOS transistor necessitates a corresponding reduction in the depths of the source/drain regions of the transistor in order to avoid unwanted short channel effects and excessive parasitic capacitances. For example, in an N-channel MOS transistor having an effective channel length of 0.5 μm, a gate oxide thickness of 250 Angstroms and a channel doping concentration of $4 \times 10^{16}$ cm$^{-3}$, short channel effects are substantially avoided if the depths of the source/drain regions are less than 1000 Angstroms below the surface of the channel. In addition, it is also desirable for the source/drain regions to have a relatively low sheet resistance (e.g., less than 70 ohms per square) to permit rapid operation of the transistor.

In the case of bipolar circuits, a reduction in the lateral spacings between the various regions of a bipolar transistor necessitates a corresponding reduction in the respective depths of those regions. For example, in a vertical bipolar transistor structure having a minimum feature size of 1 μm, it is desirable that the emitter region be less than 2000 Angstroms in order to insure control over the base width and the total base charge. Moreover, it is also desirable for the emitter region to have a relatively low sheet resistance in order to provide a high minority carrier injection efficiency and to minimize the emitter crowding effect.

In the prior art surface impurity layers are most frequently formed by either conventional diffusion or ion implantation. In a conventional diffusion process impurities are first introduced into a semiconductor surface by diffusion from an appropriate predeposition source, such as a heavily doped semiconductor oxide layer or polycrystalline semiconductor layer in contact with the surface. The impurities are then thermally driven to a desired depth in a separate drive-in step. Although surface impurity layers as shallow as 500 Angstroms may be formed by conventional diffusion by using relatively low temperatures and short diffusion times, such layers tend to have relatively low impurity concentrations and therefore relatively high sheet resistances. Since the rate of transport of impurities into a semiconductor by conventional diffusion is generally limited by the solid solubility of the impurities in the semiconductor at the diffusion temperature, conventional diffusion has the disadvantage of ordinarily not being able to provide a shallow layer with a sufficiently high impurity concentration to result in a relatively low sheet resistance.

In the case of ion implantation impurities are introduced into a semiconductor surface by bombarding the surface with a beam of ionized impurities whose kinetic energy is in the range of one to several hundred kilovolts. Since the rate of implantation is largely independent of solid solubility of the impurities in the semiconductor and the depth of implantation can be precisely controlled, ion implantation can provide relatively shallow impurity layers having much higher impurity concentrations than those obtainable by conventional diffusion. However, ion implantation generally causes lattice damage which significantly lowers the carrier mobility in an implanted region. Consequently, ion implantation has a disadvantage in that even a highly concentrated impurity layer formed thereby generally has a relatively high sheet resistance unless the lattice damage caused by ion implantation is substantially repaired by an appropriate post-implantation annealing treatment. Since such an annealing treatment normally requires heating of the implanted layer for a relatively long time or at a relatively high temperature, the implanted layer will diffuse to a relatively large depth during the annealing treatment. For that reason it is difficult to form by ion implantation a surface impurity layer which is relatively shallow (e.g., less than 2000 Angstroms) and which has a relatively low sheet resistance (e.g., less than 70 ohms per square).

Therefore, a need clearly exists for a method for forming a surface impurity layer which has a lower sheet resistance than a layer of comparable depth formed by conventional diffusion and which has a shallower depth than a layer of comparable sheet resistance formed by ion implantation.

SUMMARY OF THE INVENTION

The disadvantages of the prior art, as discussed above, are substantially removed by the present invention which is a method for forming a surface impurity layer during fabrication of a semiconductor device comprising the following steps. First, a source layer is formed to be in contact with at least a preselected area of the surface of a semiconductor bulk region, the source layer being doped with a suitable impurity. The source layer is then heated at an appropriate temperature in the presence of an appropriate reactant to cause a reaction which consumes the source layer at a rate exceeding the rate at which the impurity diffuses in the bulk region. The reaction yields a reaction product, and the impurity has a source-layer-material/reaction-product segregation coefficient which is significantly greater than unity.

In an illustrative embodiment of the present invention, a relatively thin layer of arsenic doped polycrystalline silicon (polysilicon) layer is deposited to cover at least a preselected area of a surface of a single crystal silicon bulk region. The source layer and bulk region are then heated in an oxidizing ambient, such as steam, at a temperature which causes the oxidation of the entire polysilicon layer at a rate exceeding the rate at which arsenic diffuses in silicon and in a time not longer than that required for the arsenic in the polysilicon source layer to diffuse into the bulk region to form an arsenic doped surface layer of a desired depth. The oxidation yields a layer of $SiO_2$. Since arsenic has a silicon/$SiO_2$ segregation coefficient of approximately 800, there exists an accumulation of arsenic at the $SiO_2$/silicon interface that causes the surface concentration of arsenic in the surface layer to exceed the solid solubility of arsenic in silicon. The surface layer is then annealed at a relatively low temperature for a relatively short time to activate substantially all the arsenic therein.

DETAILED DESCRIPTION

Figure 1:
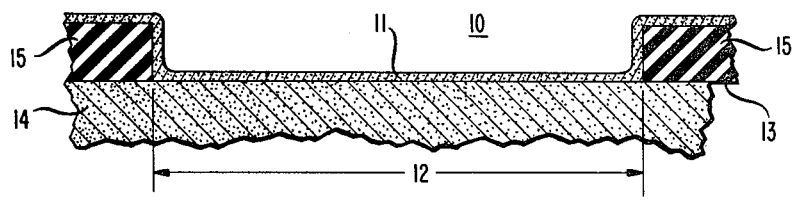
FIGS. 1 through 3 show cross-sectional views of a portion of a partially completed semiconductor device illustrating a method for forming a surface impurity layer during fabrication of the semiconductor device according to the preferred embodiment of the present invention.

Referring now to FIGS. 1 through 4, there are shown cross-sectional views of a portion of a partially completed semiconductor device 10 illustrating a method for forming a surface impurity layer in a semiconductive bulk region according to the preferred embodiment of the present invention. The same reference numerals are used throughout FIGS. 1 to 4 to denote like parts or regions of the device. In FIG. 1 a 500 Angstrom layer 11 of polysilicon is formed by conventional low pressure chemical vapor deposition (LPCVD) to be in contact with a preselected area 12 of a surface 13 of a single crystal silicon bulk region 14. The preselected area is defined by an aperture in a $SiO_2$ layer 15 approximately 3500 Angstroms thick covering the surface of the bulk region. The $SiO_2$ layer serves as a diffusion mask and delimits the portion of the surface in which an impurity layer is to be formed. The bulk region may, for example, be a portion of a substrate wafer, an epitaxial layer formed on an appropriate substrate or a relatively thick polysilicon region. The material of the bulk region may be N-type, P-type or undoped. The polysilicon source layer is doped with arsenic to a concentration of $3 \times 10^{20}$ cm$^{-3}$. The layer is doped by a conventional method, either in situ during deposition or by ion implantation or conventional diffusion after deposition. If ion implantation is used, the energy of the implant must be such that the ions do not penetrate through the polysilicon layer into bulk region. An energy of 30 KeV was found to be satisfactory for implanting a 500 Angstrom thick polysilicon layer. No annealing of the layer is necessary after the implant.

Figure 2:
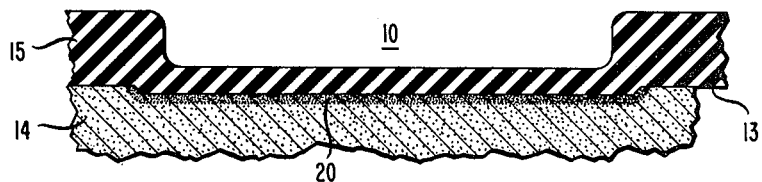

In FIG. 2, the device is heated at a temperature of approximately 950 degrees C. in the presence of steam ($H_2O$) to effect oxidation of the polysilicon layer. The polysilicon layer is permitted to be entirely consumed by oxidation in approximately 20 minutes. During that time the arsenic in the polysilicon layer can diffuse into the silicon bulk region to form a surface impurity layer 20 extending approximately 500 Angstroms below the surface of the bulk region.

When arsenic doped silicon is oxidized, the $SiO_2$ yielded by such oxidation has a tendency to reject the arsenic, which is then preferentially segregated in the unoxidized silicon. The ratio of the equilibrium concentration of an impurity in the silicon to that in the silicon dioxide is denoted by the term silicon/$SiO_2$ segregation coefficient and is defined as $$m = \frac{\text{Equilibrium Concentration of Impurity in Silicon}}{\text{Equilibrium Concentration of Impurity in SiO}_2}$$

Since arsenic has a silicon/$SiO_2$ segregation coefficient of approximately 800, nearly all of the arsenic in the polysilicon source layer is segregated in the unoxidized portion of the layer during oxidation. Upon completion of the oxidation, nearly all of the arsenic in the region of the polysilicon layer above the preselected area of the surface will be driven into the bulk region below.

Because the oxidation rate of the polysilicon layer at 950 degrees C. in steam is greater than the rate at with arsenic diffuses in the polysilicon layer and the bulk region at that temperature, there is an accumulation of arsenic at the $SiO_2$/silicon interface which increases with oxidation time. To a lesser extent, there is also an accumulation of arsenic at the polysilicon/single crystal silicon interface due to grain boundary diffusion and segregation of the arsenic. After the polysilicon layer is completely oxidized, the arsenic concentration at the $SiO_2$/silicon interface in the bulk region is approximately $5 \times 10^{20}$ cm$^{-3}$, which is nearly twice the solid solubility of arsenic in silicon at 950 degrees C. Therefore, the oxidation of the arsenic doped polysilicon layer provides a surface impurity layer 20 having a considerably higher surface concentration of arsenic than that which can be provided by conventional diffusion. Steam oxidation of the polysilicon source layer may also be performed at other temperatures, advantageously in the range of 800 to 950 degrees C.

It should be noted that the polysilicon layer 11 does not oxidize uniformly. Owing to the negligibly small diffustivity of arsenic in $SiO_2$ as compared with that in single crystal silicon, the accumulation of arsenic at the $SiO_2$/silicon interface is greater in the region of the polysilicon layer above the $SiO_2$ layer 15 than in the region above the silicon bulk region. Since the oxidation rate of silicon decreases as the arsenic concentration therein increases, it is necessary to "over-oxidize" the region of the polysilicon layer above the bulk region and consume approximately 200 Angstroms of the bulk region in order to obtain complete oxidation of the polysilicon layer above the $SiO_2$ layer. Over-oxidation may be avoided by forming the source layer to cover only the preselected area of the bulk region surface or by doping only the region of the source layer above the preselected area.

Figure 3:
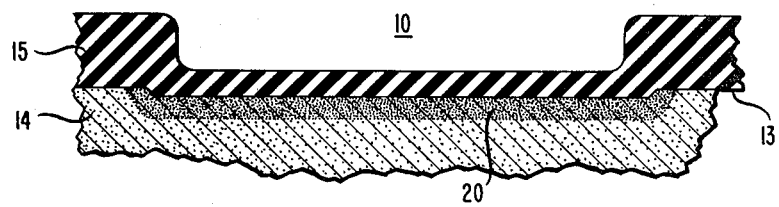

After complete oxidation of the polysilicon layer, the surface impurity layer 20 has a relatively high sheet resistance of approximately 140 ohms per square, owing to a significant portion of the arsenic impurities in the layer not occupying proper substitutional lattice sites. However, the oxidation of the polysilicon layer causes relatively little lattice damage in the bulk region. Therefore, only a relatively short annealing treatment of approximately 30 minutes at approximately 950 degrees C. in nitrogen is required to activate substantially all the arsenic impurities therein. As shown in FIG. 3, the annealing causes the surface impurity layer to diffuse further into the bulk region to a depth of approximately 1000 Angstroms below the surface of the bulk region, and the sheet resistance of the layer goes to a relatively low value of approximately 67 ohms per square. The annealing, which is required only when the surface concentration of the impurity layer exceeds the solid solubility, may be performed at other temperatures, advantageously in the range of 850 to 1000 degrees C., and for other durations, advantageously in the range of 10 minutes to 4 hours.

Figure 4:
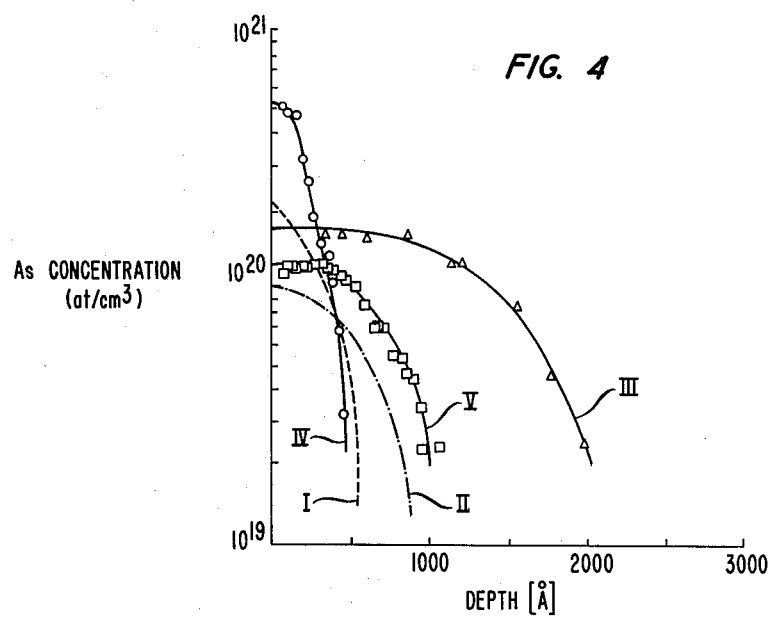
FIG. 4 shows a graph comparing the arsenic profiles of arsenic doped surface layers formed by prior art methods with those formed by methods in accordance with the present invention.

Referring now to FIG. 4 there is shown a graph comparing the arsenic concentration profiles of arsenic doped surface impurity layers formed by various methods. Curve I represents the impurity profile(arsenic concentration versus depth below the silicon surface) of an arsenic doped layer in silicon formed by conventional diffusion at a temperature of approximately 950 degrees C. for approximately 20 minutes. The diffused layer has a depth of approximately 500 Angstroms, a sheet resistance of approximately 176 ohms per square, and a surface concentration of approximately $2.2 \times 10^{20}$ cm$^{-3}$, which is about the solid solubility of arsenic in silicon at 950 degrees C. Curve II represents the impurity profile of the layer represented by curve I after a drive-in at approximately 950 degrees C. for approximately 30 minutes. After annealing the diffused layer has a depth of approximately 900 Angstroms and a sheet resistance of approximately 140 ohms per square. Curve III represents the impurity profile of an arsenic doped layer in silicon formed by ion implantation at a dose of approximately $3 \times 10^{15}$ cm$^{-2}$ and an implant energy of approximately 30 KeV. After implantation the sample was annealed at 900 degrees C. in dry oxygen for 30 minutes and at 950 degrees C. in nitrogen for 30 minutes. This relatively long annealing treatment is conventionally used to repair the lattice damage caused by the ion implantation. After the annealing the implanted layer has a depth of approximately 2000 Angstroms and a sheet resistance of approximately 44 ohms per square. Curve IV represents the impurity profile of an arsenic doped layer in silicon formed according to the present invention by oxidation of a polysilicon layer approximately 500 Angstroms thick and uniformly doped with arsenic at a concentration of approximately $3 \times 10^{20}$ cm$^{-3}$. The polysilicon layer was completely oxidized at approximately 950 degrees C. in steam approximately 20 minutes. After oxidation the arsenic doped layer is approximately 450 Angstroms in depth and has a sheet resistance of approximately 140 ohms per square. Comparing curves I and IV, it will be noted that the impurity layer formed by oxidation has a steeper impurity concentration profile and a higher surface impurity concentration than those of the impurity layer formed by conventional diffusion. Curve V represents the impurity profile of the arsenic doped layer represented by curve IV after annealing at approximately 950 degrees C. for approximately 30 minutes to activate the arsenic impurities. The annealing treatment is relatively short since the oxidation method for forming an impurity layer causes relatively little lattice damage. After the annealing, the arsenic doped layer has a depth of approximately 1000 Angstroms and a sheet resistance of approximately 67 ohms per square. From a comparison of curves I-V, it is apparent that the present invention provides a surface impurity layer which has a lower sheet resistance than a layer of comparable depth formed by conventional diffusion and which has a shallower depth than a layer of comparable sheet resistance formed by ion implantation.

Although the preferred embodiment of the present invention uses arsenic for forming a surface impurity layer in silicon by oxidation of an arsenic doped polysilicon source layer, it is contemplated that other suitable species of impurities as well as other source-layer materials may be substituted. For example, other donor impurities for silicon, such as phosphorus and antimony, have silicon/SiO$_2$ segregation coefficients which are significantly greater than unity and may therefore be substituted for arsenic for forming N-type impurity layers in silicon. However, arsenic has the advantages of a relatively high silicon/SiO$_2$ segregation coefficient and a relatively low diffusivity which increases with arsenic concentration. For the formation of a shallow impurity layer having a high surface concentration, it is advantageous to select an impurity which has the highest segregation coefficient and the lowest diffusivity.

Given a particular species of impurities and a particular source-layer material, the depth and surface concentration of an impurity layer formed by oxidation of the source layer is a function of the thickness and impurity concentration of the source layer and the rate of oxidation. The conditions of the oxidation, i.e., temperature and ambient, should be selected to provide an oxidation rate which exceeds the rate at which the impurities diffuse in the bulk region at the oxidation temperature and which provides for complete oxidation of the source layer in a time not longer than that required for the impurities in the source layer to diffuse into the bulk region to form an impurity layer of a desired depth. If annealing of the impurity layer is needed after oxidation, the extent of further diffusion of the impurity layer during annealing should be taken into account. Steam is advantageously used over other oxidizing ambients for silicon, since a steam ambient provides a relatively faster oxidation rate at a given temperature.

Although the present invention provides particular advantages for the formation of relatively shallow impurity layers, it is equally applicable to the formation of relatively thick impurity layers by making appropriate changes in the thickness of the source layer and the conditions of oxidation.

If ion implantation is used to dope the source layer, it may be advantageous, from the standpoint of obtaining shallower impurity layers, to implant only a portion of the source layer adjacent to the target surface. During oxidation of such a nonuniformly implanted source layer, the implanted impurities must first diffuse through the unimplanted portion of the source layer before entering the bulk region. Therefore, for a given oxidation rate the use of such a nonuniformly implanted source layer would provide a shallower impurity layer than the use of a uniformly doped source layer.

Although in the preferred embodiment of the present invention, the sample is heated in an oxidizing ambient to cause oxidation of the source layer, it is also contemplated that another appropriate reactant may be substituted to cause another reaction that would consume the source layer at a rate exceeding the rate at which the impurities diffuse in the bulk region and that would provide a reaction product in which the source-layer-material/reaction-product segregation coefficient is significantly greater than unity. For example, a polysilicon source layer doped with boron may be heated at an appropriate temperature in the presence of platinum to cause a reaction which consumes the source layer at a rate exceeding the rate at which boron diffuses in silicon. The reaction would replace the polysilicon layer with a layer of PtSi, and boron has a PtSi/silicon segregation coefficient which is significantly greater than unity. The platinum is deposited in a layer over the polysilicon layer, or is deposited simultaneously with the deposition of the polysilicon layer.

It will be understood by those skilled in the art that the foregoing and other modifications and substitutions may be made to the described embodiment without departing from the spirit and scope of the present invention. For example, the source layer may be of a single crystal material such as an epitaxially grown material instead of a polycrystalline material, and the source layer and the bulk region may be of different materials.

What is claimed is:

1. A method for forming a shallow high-concentration impurity layer adjacent to a surface of a semiconductive bulk region in a device structure, characterized in that the method comprises the steps of:
    a. forming a source layer in contact with at least a preselected area of the surface, the source layer being doped to a high concentration with a suitable impurity;
    b. and heating the source layer at an appropriate temperature in the presence of an appropriate reactant to cause a reaction which completely consumes the source layer at a rate exceeding the rate at which the impurity diffuses in the bulk region, the reaction yielding a reaction product and the impurity having a source-layer-material/reaction-product segregation coefficient significantly greater than unity, so as to form an impurity concentration at the interface between the reaction product and the bulk region that is substantially larger than the initial impurity concentration in the source layer, which impurity concentration at the interface exceeds the solid solubility of the impurity in the bulk region.

2. A method as recited in claim 1 further characterized in that the reactant is an appropriate oxidizing ambient, the reaction is oxidation, the reaction product is an oxide of the source layer material and the source-layer-material/reaction-product segregation coefficient is the source-layer-material/source-layer-oxide segregation coefficient.

3. A method as recited in claim 2 further characterized in that the thickness of the source layer, the impurities in the source layer, the concentration thereof and the temperature and ambient of the oxidation are selected to provide an impurity layer of a desired depth and surface concentration.

4. A method as recited in claim 3 further characterized in that the bulk region is single crystal silicon, the source layer is polycrystalline silicon, the source-layer-material oxide is silicon dioxide and the source-layer-material/source-layer-oxide segregation coefficient is the silicon/silicon dioxide segregation coefficient.

5. A method as recited in claim 4 further characterized in that the polycrystalline silicon source layer is formed by chemical vapor phase deposition and doped during such deposition.

6. A method as recited in claim 4 further characterized in that the polycrystalline silicon source layer is formed by chemical vapor phase deposition and doped by ion implantation after deposition.

7. A method as recited in claim 6 further characterized in that only a portion of the source layer is doped by ion implantation.

8. A method as recited in claims 5, 6 or 7 further characterized in that the source layer is doped with arsenic, the source layer is heated in a steam ambient at a temperature in the range of 800 degrees C. to 950 degrees C. to cause complete oxidation thereof, and after oxidation of the source layer the bulk region is annealed at a temperature in the range of 850 to 1000 degrees C. for a time in the range of 10 minutes to 4 hours.

9. A method as in claim 1 wherein the bulk region comprises monocrystalline silicon, the source layer comprises polycrystalline silicon having a prescribed thickness and, wherein as a result of the aforespecified heating step, the polycrystalline silicon layer is completely oxidized to transfer substantially all of the impurities initially therein into a surface layer of said monocrystalline silicon region, said surface layer having a thickness approximately equal to said prescribed thickness.

10. A method as in claim 9 wherein said device structure is further heated for a time and at a temperature to activate the impurities transferred into said silicon region and to increase the thickness of the impurity layer to no more than approximately twice the prescribed thickness.

11. A method as in claim 10 wherein said polycrystalline layer is approximately 500 Angstrom units thick and is doped to an impurity concentration of approximately $3 \times 10^{20}$ cm$^{-3}$.

12. A method for forming in a silicon monocrystalline body a shallow surface layer having a high dopant concentration, said method comprising the steps of
    forming a polycrystalline silicon layer of thickness less than the thickness of the shallow layer desired and having a high dopant concentration,
    heating the body in an oxidizing atmosphere for a time and at a temperature to oxidize the polycrystalline layer completely and to transfer substantially all of the dopant in such polycrystalline layer into a surface layer of the body of first thickness approximately equal to the thickness of the polycrystalline layer whereby the concentration of the dopant at the interface between the oxidation product and the silicon body is substantially larger than the initial concentration in the layer,
    and heating the body for a time and at a temperature to activate the dopant transferred into the body and to increase the thickness of the dopant layer in the body to no more than approximately twice the first thickness.

* * * * *